United States Patent [19]

Watrous et al.

[11] Patent Number: 5,532,635
[45] Date of Patent: Jul. 2, 1996

[54] VOLTAGE CLAMP CIRCUIT AND METHOD

[75] Inventors: Donald L. Watrous; Victor A. K. Temple, both of Clifton Park, N.Y.

[73] Assignee: Harris Corporation, Melbourne, Fla.

[21] Appl. No.: 304,554

[22] Filed: Sep. 12, 1994

[51] Int. Cl.⁶ .......................... H03K 5/08; H03K 17/687; H03K 3/00; H02H 3/22
[52] U.S. Cl. .......................... 327/310; 327/110; 327/427; 327/434; 361/110
[58] Field of Search .................................. 327/310, 379, 327/387, 389, 108, 110, 384, 493, 434; 361/111, 118, 120, 56, 104; 400/121

[56] References Cited

U.S. PATENT DOCUMENTS

| | | | |
|---|---|---|---|
| 4,677,518 | 6/1987 | Hershfield | 361/493 |
| 4,808,018 | 2/1989 | Robertson et al. | 400/121 |
| 4,827,497 | 5/1989 | Norris et al. | 327/493 |
| 5,010,261 | 4/1991 | Steigerwald | 327/434 |
| 5,210,451 | 5/1993 | Griining et al. | 327/384 |
| 5,311,393 | 5/1994 | Bird | 361/104 |
| 5,388,021 | 2/1995 | Stahl | 361/56 |

Primary Examiner—David C. Nelms
Assistant Examiner—Trong Phan
Attorney, Agent, or Firm—Rogers & Killeen

[57] ABSTRACT

An active clamp circuit for controlling over-voltage, surge conditions in electrical circuits. The active clamp includes a varistor which is switched into a circuit by a high power switch upon the detection of a surge condition. The use of a MOS Controlled Thyristor ("MCT") as a means for the switching the varistor permits the circuit to withstand a high di/dt and surge current while maintaining both on and off gated control of the switch.

24 Claims, 1 Drawing Sheet

5,532,635

VOLTAGE CLAMP CIRCUIT AND METHOD

BACKGROUND OF THE INVENTION

The present invention is related generally to circuits for protecting electrical circuits, elements or devices from surges in power lines and particularly to a circuit for detecting and absorbing electrical power surges in relatively high power applications.

It is well known that electrical circuits often experience surges in the power supplied to the circuit. These power surges may be due to a wide variety of disturbances, such as equipment failure or inadvertent destruction, or natural disturbances such as lightening strikes. Such surges often occur quickly, leaving little time to respond in a fashion to protect electrical equipment connected to the surging line.

To protect electrical equipment from surges, it is known to use varistors, which are devices in which electrical resistance decreases in response to increasing current. The varistors used in surge circuits may be placed in a circuit such that when an increase in the power to the circuit is sensed by the varistor, the varistor's electrical resistance decreases and the surging power is shunted across the varistor and away from more surge sensitive components.

The maximum voltage that can be continuously impressed across a varistor is generally limited by its steady state power dissipation rating. Under surge conditions, a varistor can absorb a pulse of energy determined by its mass and peak allowable temperature. Typically, the varistor clamping voltage is in the order of twice its steady state rating.

An efficiency which has been experienced in the use of such devices in surge suppression is the loss of power across the varistor when the power is not in a surge condition. Such a loss of power could be reduced if the varistor was actively switched into a circuit to be protected as needed; however, because varistors typically conduct surge currents of hundreds to thousands of amps, it has generally not been practical to combine varistors with active switching devices.

Another difficulty which has been experienced in the prior art is the use of varistors in surge suppression circuits having high energy repetitive pulses. Because such pulses often produce a gradual increase in the leakage current and nominal clamping voltage, high energy repetitive pulses in varistor circuits can lead to thermal runaway and catastrophic failure.

It is accordingly an object of the present invention to provide a novel circuit and method for obviating these and other difficulties in the prior art.

It is another object of the present invention to provide a novel circuit and method for suppressing surge voltages which are a relatively small increase over the steady state applied power.

It is a further object of the present invention to provide a novel circuit and method for rapidly switching a varistor into a circuit upon the detection of a rising surge voltage.

It is still another object of the present invention to provide a novel circuit and method for suppressing transient voltages which are repetitively generated as a consequence of normal circuit operation.

These and many other objects of the present invention will be more fully understood by one skilled in the art by reference to the accompanying drawings and the detailed description that follows.

DESCRIPTION OF PREFERRED EMBODIMENTS

Figure 1:
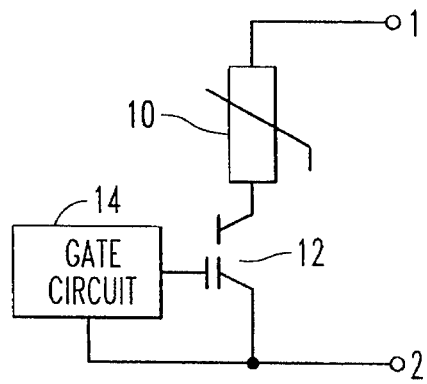
FIG. 1 is a simplified circuit diagram of a surge suppression circuit in accordance with the present invention.

With reference to FIG. 1, the circuit of the present invention may be used to suppress surge occurring across terminals 1 and 2. The terminals may be connected across a load or other electrical elements or circuits to be protected from surge. The circuit may include a varistor 10 and a MOS Controlled Thyristor ("MCT") 12 connected in series across the terminals 1,2. The operation of the MCT is controlled by a gate circuit 14.

In operation, when the power is quiescent, the MCT will be off and the power dissipated across the series of the varistor and the MCT will be extremely small. The gate circuit 14 may be any conventional design to detect a surge condition and to apply a gating signal to the MCT when the surge condition is detected. For example, the gate circuit could detect a surge of 125% of the steady state applied voltage and upon detection of such a condition would cause the MCT 12 to turn on by supplying the appropriate gate signal to the MCT 12. Thus, the series of the MCT and the varistor will limit the peak voltage of the surge by absorbing the transient energy. When the clamped voltage has returned to its normal steady state, the current through the varistor will be small (due to the varistor's non-linear V/I characteristic) and the MCT can again be turned off to limit the steady state power dissipation in the varistor.

The use of the MCT 12 as the switching device permits the surge suppression circuit to withstand the high di/dt and current usually associated with surges while permitting precise on-off gate control at desired switch points.

The gate circuit 14 may be any conventional gate control circuit which detects a specified condition and applies an appropriate gating signal to the MCT. For example, the detector may be implemented as a voltage divider circuit which senses the line voltage and when a predetermined voltage (or divided voltage) occurs and is sensed, a turn on signal is applied to the gate of the MCT. The predetermined voltage may less than twice the steady state voltage rating of varistor 10.

Figure 2:
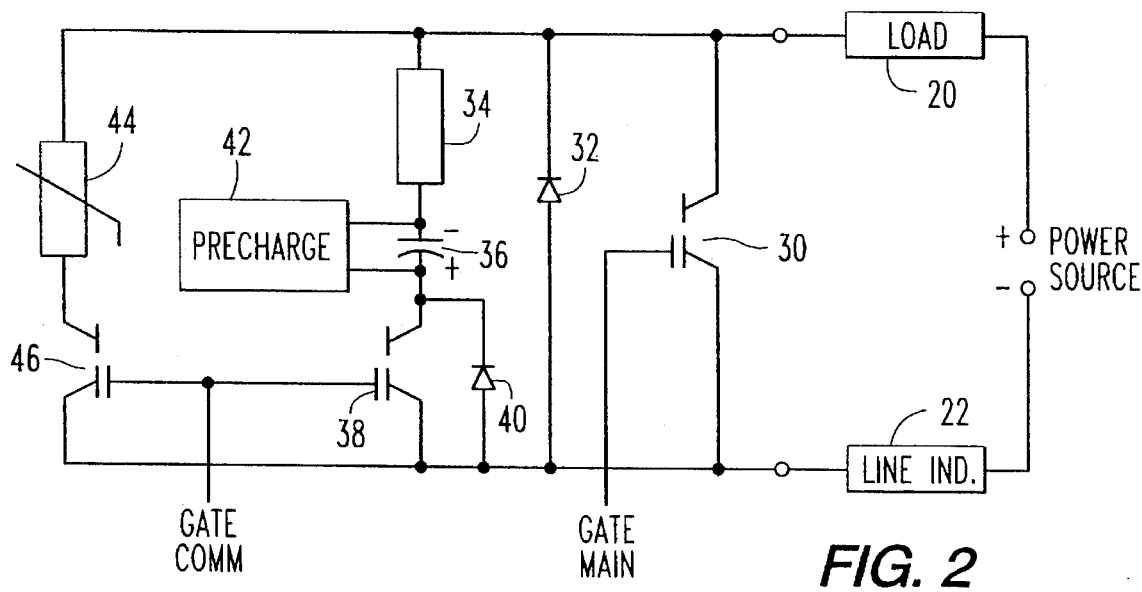
FIG. 2 is a simplified circuit diagram of an alternative embodiment of a surge suppression circuit in accordance with the present invention used in association with a circuit breaker.

With reference to FIG. 2, a circuit in accordance with the present invention may also be used in a solid state breaker in which relatively high transient energy may be generated as a consequence of opening the solid state contacts. In such applications, the power control circuit may be modified to gate the varistor switching MCT at the proper time. Power may be applied to a load 20 in a circuit having a line inductance 22. An MCT 30 (the "main MCT) may serve as the contacts of a circuit breaker and may carry a fault current more than ten times its steady state rating. The current through the main MCT 30 may be interrupted by using a conventional commutation circuit. A diode 32 may be connected across the MCT 30. A series of an inductor 34, capacitor 36 and an MCT 38 may be placed across the main MCT 30. A second diode 40 may be placed across the MCT 38 and a conventional pre-charge circuit 42 may be used to pre-charge the capacitor 36. A varistor 44 and a varistor controlling MCT 46 are also placed across the main MCT 30.

In operation, the capacitor 36 is precharged to the polarity shown in FIG. 2 and the commutation cycle consists of resonately discharging the capacitor 36 through the MCT 38, the diode 32 and the inductor 34. This cycle reverse biases the main MCT 30, allowing it to regain forward blocking. The MCT 46 operates to selectively bring the varistor 44 into the circuit to suppress the transient voltages caused by the operation of the breaker switch.

Figure 3:
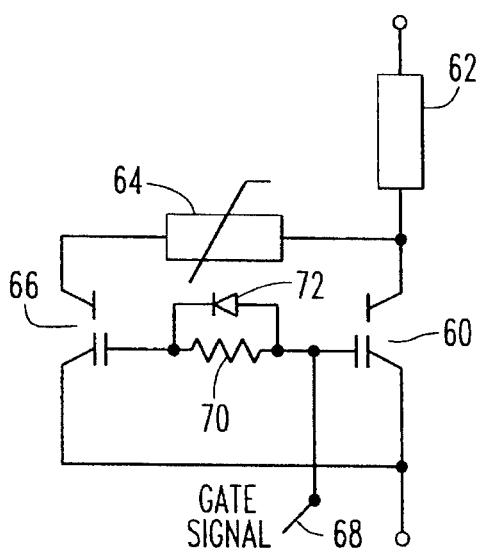
FIG. 3 is a simplified circuit diagram of an alternative embodiment of a surge suppression circuit in accordance with the present invention.

With reference to FIG. 3, and in contrast to the breaker switch of FIG. 2 in which occasional and random transients are generated, the present invention may also be used in circuits in which repetitive transients are generated across a power device. The circuit generating the transients may be a conventional inverter switch including a switching MCT 60 in series with stray inductance 62. The energy in the stray inductance typically produces a voltage transient across the switching MCT 60 as it switches off. In conventional circuits, an RC-diode snubber would be connected across the switching MCT 60 to absorb most of the energy from the stray inductance 62 and limit the transient voltage. In the circuit of the present invention, a varistor 64 is switched into the inverter circuit by an MCT 66. Both MCTs 60 and 66 are controlled by a common gate signal, which is applied directly to the switching MCT 60 and through a parallel resistor 70 and diode 72 to the MCT 66 controlling the varistor 64.

In operation, the switching MCT 60 is operated in a conventional fashion being turned on by an appropriate gate signal 68. At turn on, practically no current flows through the varistor 64 because of the conduction of the switching MCT 60. When the switching MCT is gated off by an appropriate gate signal 68, the gate signal is delayed by the time constant of the resistor 70 and the gate capacitance. During this time interval, the varistor will conduct, suppressing the voltage transient. At the end of the transient current through the varistor 64 and its controlling MCT 66 will be low, due to the non-linear V/I characteristic of the varistor 64, allowing the controlling MCT 66 to turn off safely.

Because the varistor 64 is switched into the circuit only during the voltage transients, the repetitive pulses of energy absorbed by it are of relatively low energy. Even in the presence of degradation of the varistor through leakage current, the circuit of FIG. 3 remains operational until the leakage increases several orders of magnitude and reaches the a amp range. Also because the varistor is active only during the transients, it is much less likely to be subject to thermal runaway.

Figure 4:
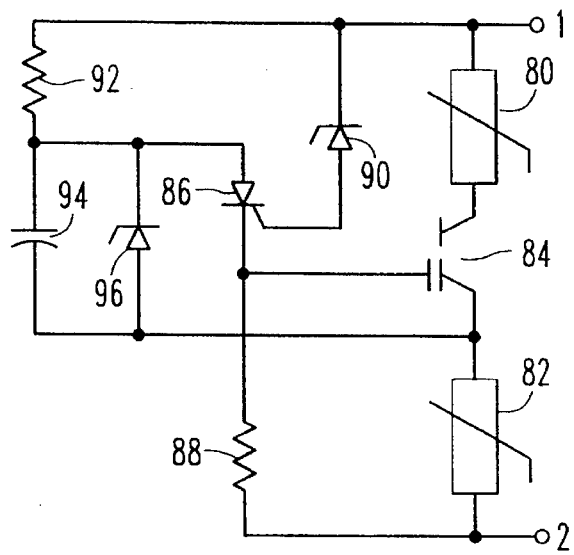
FIG. 4 is a simplified circuit diagram of an alternative embodiment of a surge suppression circuit in accordance with the present invention.

With reference now to FIG. 4, a circuit in accordance with the present invention may also be used in circuits in which the transients occur randomly. Normally, a steady state dc voltage appears at the terminals 1, 2. Across the terminals 1,2 is connected a series of a first varistor 80, a MCT 84, and a second varistor 82. An SCR 86 has its output connected to the gate of the MCT 84 and to the second terminal 2 through a resistor 88. The gate of the SCR 86 is connected through a zener diode 90 to the first terminal 1. The base of the SCR 86 is connected through a second resistor 92 to the first terminal 1 and through parallel capacitor 94 and a second zener diode 96 to the output of the MCT 84.

In operation, and with a steady state voltage across the terminals 1, 2, a small current flows through the second resistor 92 and the second zener diode 96 to establish a voltage across the second varistor 82. This voltage appears as a negative gate bias on the MCT 84 through the resistor 88. The voltage across the second zener diode 96 establishes a charge on the capacitor 94. When the voltage across the terminals 1, 2 transiently exceeds the breakdown voltage of the zener diode 90, the SCR 86 is gated on, which in turn, gates on the MCT 84. The charge in the capacitor 94 keeps the MCT 84 on for a finite time (longer than the voltage surge). Thus, the surge is absorbed by the varistors 80, 82 while the MCT is on.

Current through the resistor 88 discharges the capacitor 94. The amount of the current through the resistor 92 is selected to be less than the holding current of the SCR 86. The value of the resistor 88 is selected to pass several times the current that flows through the second resistor 92. Thus, as the capacitor 94 discharges, the current through the SCR 86 will decrease below its holding value and the SCR 86 will turn off, switching off the MCT 84.

While the present invention has been described in terms of particular examples, those of skill in the art will understand based on the material presented herein that this is merely for convenience of explanation and not intended to be limiting. While particular sets of elements are illustrated for providing the desired surge suppression, other combinations and structures may be used. Accordingly, the present invention is intended to include these and other variations as will occur to those of skill in the art based on the descriptions herein in the claims that follow.

What is claimed is:

1. In an electrical circuit in which a power source supplies electrical power to a load, a circuit for reducing the transmission of surge voltage to the load comprising:

a switch electrically connected in series with a varistor, said series being electrically connected across said load; and a switch drive circuit controlling said switch so that said switch is off when no surge is present and said switch is on when surge is present to thereby permit said varistor to absorb the energy of the surge during the surge.

2. The circuit of claim 1 wherein said switch drive circuit comprises:

surge sensing means for sensing the surge in said circuit;

turn-on signal generating means for generating a switch turn-on signal when said surge sensed by said surge sensing means exceeds a specified clamp voltage thereby activating said switch; and switch deactivating means for deactivating said switch when the surge dissipates.

3. The circuit of claim 2 wherein said switch comprises an MOS Controlled Thyristor.

4. An electrical switch circuit having reduced voltage transients across said electrical switch during turn-off, comprising:

a first MCT electrically connected to operate as a power switch;

a varistor and a second MCT connected in series, the series being electrically connected across said first MCT;

a resistor and diode electrically connected in parallel to one another and interconnecting the gate terminals of said first and second MCTs.

5. The electrical switch of claim 4 wherein said second MCT continues to conduct for a period of time after the turn off of the first MCT to suppress voltage transients across said switch.

6. The electrical switch of claim 5 wherein the period of time during which the second MCT conducts after the turn off of the first MCT is related to the size of said resistor and the capacitance of the gate terminal.

7. A circuit to suppress voltage transients across a load, said circuit comprising:

an SCR connected in series between a first diode and a first resistor, said series being connected across said load;

an MCT interconnected in series between first and second varistors, said series being connected across said load, the gate terminal of said MCT being electrically connected to the output terminal of said SCR;

a second resistor and a capacitor being connected in series between a terminal of said load and said second varistor;

a second zener diode connected across said capacitor;

wherein a voltage transient across the load causes the SCR to turn on which causes the MCT to turn on, absorbing the voltage transient across said first and second varistors.

8. The circuit to suppress of claim 7 wherein the voltage transient charges said capacitor thereby keeping said MCT turned on for a longer period of time than the voltage surge.

9. The circuit to suppress of claim 7 wherein during the surge the current through said first resistor is less than the holding current of said SCR.

10. The circuit to suppress of claim 7 wherein during a surge the current through said second resistor is at least several times greater than the current through said first resistor.

11. The circuit to suppress of claim 7 wherein said SCR is turned on when the transient voltage exceeds the breakdown voltage of said first diode.

12. A switched varistor voltage clamp for clamping voltage surges in a circuit comprising:

a high power switch responsive to a specified turn-on signal and a specified turn-off signal;

a varistor circuit in series with said high power switch, said varistor circuit having at least one varistor; and, switch control means for selectively producing said turn-on signal and said turn-off signal to thereby selectively activate said high power switch when there is a voltage surge so that voltage surges occurring in the circuit are dissipated by said varistor circuit and deactivate said high power switch when the voltage surge is no longer present.

13. A switched varistor voltage clamp for clamping voltage surges in a circuit comprising:

a high power switch responsive to a specified turn-on signal and a specified turn-off signal;

a varistor circuit is series with said switch; and switch control means for providing said turn-on and turn-off signals to operate said switch whereby surges occurring in the circuit are dissipated by said varistor circuit, said switch control means comprising, voltage surge sensing means for sensing a voltage surge in said circuit;

turn-on signal generating means for generating said turn-on signal when said voltage surge sensed by said voltage sensing means exceeds a specified clamp voltage thereby activating said high power switch; and switch deactivating means for deactivating said high power switch when said voltage surge dissipates.

14. The voltage clamp of claim 13 wherein said switch deactivating means comprises:

current monitoring means for monitoring a switch current through said high power switch; and turn-off signal generating means for generating a turn-off signal when said switch current falls below a specified minimum current thereby deactivating said high power switch.

15. The voltage clamp of claim 13 wherein said high power switch is an MCT switch.

16. The voltage clamp of claim 13 wherein said specified clamp voltage is less than twice the steady state voltage rating of said varistor circuit.

17. The voltage clamp of claim 12 wherein said varistor circuit comprises two varistors in series with each other.

18. The voltage clamp of claim 13 used as a circuit breaker wherein said voltage surges are random and unpredictable.

19. The voltage clamp of claim 13 wherein said voltage surges are repetitive and predictable.

20. The voltage clamp of claim 19 wherein said voltage surges are produced by an inverter circuit.

21. A method of clamping voltage surges in a circuit comprising the steps of:

(a) providing a high power signal with random voltage surges;

(b) detecting said voltage surges;

(c) generating a turn-on signal when said voltage surges exceed a specified clamp voltage;

(d) activating a high power switch in response to the turn-on signal when said voltage surges are detected thereby passing the current of said high power signal through a varistor circuit in series with said high power switch whereby said varistor absorbs unwanted energy; and (e) deactivating said high power switch when said voltage surge dissipates.

22. The method of claim 21 wherein said high power switch is an MCT switch.

23. The method of claim 21 wherein said deactivating step further comprises:

(a) monitoring the current passing through said high power switch when activated; and (b) generating a turn-off signal when said current drops below a specified maximum current; and (c) deactivating said high power switch in response to said turn-off signal.

24. In a switched varistor circuit for clamping voltage surges, the improvement comprising a high power MCT switch in series with a varistor to thereby create a switched varistor circuit where the clamp voltage of said switched varistor circuit is less than twice the steady state voltage rating of said switched varistor circuit, said switch being activated when a voltage surge exceeds said clamp voltage and deactivated when said voltage surge dissipates.

* * * * *